United States Patent [19]
Gebara

[11] Patent Number: 5,315,069
[45] Date of Patent: May 24, 1994

[54] ELECTROMAGNETIC RADIATION REDUCTION TECHNIQUE USING GROUNDED CONDUCTIVE TRACES CIRCUMSCRIBING INTERNAL PLANES OF PRINTED CIRCUIT BOARDS

[75] Inventor: Ghassan R. Gebara, Spring, Tex.

[73] Assignee: Compaq Computer Corp., Houston, Tex.

[21] Appl. No.: 955,928

[22] Filed: Oct. 2, 1992

[51] Int. Cl.$^5$ ................................................ H05K 1/00
[52] U.S. Cl. .................................. 174/250; 174/262; 361/794
[58] Field of Search ............... 174/262, 263, 264, 265, 174/266, 250; 361/412, 414

[56] References Cited

U.S. PATENT DOCUMENTS

| | | |
|---|---|---|
| 4,916,260 | 4/1990 | Broaddus et al. |
| 5,041,700 | 8/1991 | Iyogi et al. |
| 5,102,749 | 4/1992 | Enloe et al. |
| 5,183,972 | 2/1993 | Duane et al. |

*Primary Examiner*—Leo P. Picard
*Assistant Examiner*—Cheryl R. Figlin
*Attorney, Agent, or Firm*—Pravel, Hewitt, Kimball & Krieger

[57] ABSTRACT

An EMR reduction technique using grounded conductive traces and vias circumscribing the internal planes of printed wiring boards. Conductive vias are placed in a circuitous path near the border and encircling the signal traces of each layer of a printed circuit board. The ground plane is extended to encompass and electrically ground each of the vias. For each signal plane, a conductive trace is routed and connected to each of the vias forming a grounded shield around the signal-carrying traces on the signal plane. For the power planes, a conductive trace is also provided connecting the conductive vias and forming a grounded shield around the power planes. A non-conductive path is provided between the power plane and the power plane conductive trace to electrically isolate the voltages of the power plane from the grounded conductive trace.

7 Claims, 6 Drawing Sheets

ELECTROMAGNETIC RADIATION REDUCTION TECHNIQUE USING GROUNDED CONDUCTIVE TRACES CIRCUMSCRIBING INTERNAL PLANES OF PRINTED CIRCUIT BOARDS

BACKGROUND OF THE INVENTION

1. Field of the Invention

The present invention concerns reducing electromagnetic radiation generated by high speed digital signals in computer systems by using grounded conductive traces circumscribing the internal layers or planes of printed circuit boards.

2. Description of the Related Art

Computer systems are being designed to operate at lower power and higher speeds. For example, typical personal computer systems operate at clock speeds of 25 to 66 megahertz (MHz) or more and are designed to operate more efficiently and consume less power, with frequency and efficiency increasing almost daily. In general, the higher the frequency of the clock and other digital signals of the computer system, the more operations the computer system can perform per second. Higher frequency signals, therefore, are deemed desirable since they allow faster operation which enhances system performance. Most digital computer systems use digital logic signals based on square waves, so that higher frequency digital signals include faster rising and falling edges. The fast rise and fall edges include very high frequency content which increases the electromagnetic energy of the digital signals. The increased electromagnetic energy, in turn, increases the electromagnetic radiation (EMR) produced by the digital signals, which may then be received and cause electromagnetic interference (EMI) in nearby circuitry and electronic devices, such as aircraft navigation, commercial radio systems, televisions and other communications equipment.

The EMR generated by high speed digital signals is typically coupled through stray capacitance of nearby circuitry, resulting in EMI in the form of current or voltage spikes. The problem of EMI is exacerbated by the fact that electronic devices are being designed at lower power levels, implying higher impedance circuitry, where the higher impedance tends to amplify the electronic noise. In computer systems, the faster edges and higher frequencies are used to effect higher resolution, so that much less output noise is permitted. Even relatively small amounts of stray capacitance can couple significant noise levels if exposed to EMR caused by high speed logic signals. Reducing stray capacitance is desirable, but it is very difficult, if not impossible, to remove all stray capacitance. In any event, the primary focus for most electronic design engineers is on reducing EMR. Since high speed digital signals are desirable to improve system performance in spite of the additional electronic noise levels, isolation of the source and reduction of EMR is the goal, especially in computer systems.

The U.S. Federal Communications Commission (FCC) regulates the amount of radiated and conducted emissions generated by electronic devices including computer systems and peripheral devices, and has developed a classification system indicating acceptable levels of EMR for particular uses. It is very desirable to keep the standard high, and thus the EMR low, when designing electronic devices for home use, since the typical home includes a high number of susceptible electronic devices, such as televisions, video cassette recorders, stereos and many other home electronic devices. The FCC must certify each piece of hardware including computer systems and peripheral devices before the hardware can be sold of even displayed at a trade show. The FCC defines two levels of certification of electronic devices based on the amount of non-ionizing radiation emitted at certain specified distances. A class A device is suitable for commercial use only, where EMR is measured at 10 meters and must not exceed 90 microvolts per meter ($\mu V/m$) for the 30–88 MHz frequency range, 150 $\mu V/m$ for the 88–216 MHz range, 210 $\mu V/m$ for the 216–960 MHz range and 300 $\mu V/m$ above 960 MHz. A class B rating is met when the EMR measurements taken at 3 meters do not exceed 100 $\mu V/m$ for 30–88 MHz, 150 $\mu V/m$ for 88–216 MHz, 200 $\mu V/m$ for 216–960 MHz and 500 $\mu V/m$ for frequencies greater than 960 MHz. A class B rating is a tighter standard desirable for home use and for portable computer use. Computer designers must constantly seek new and improved methods of reducing EMR in order to qualify for a class B rating as system frequencies increase. Due to the ever increasing demand for greater capabilities at lower power, however, it is becoming more difficult to meet this standard. In fact, the first prototype versions of new computer systems rarely qualify for class B, so that engineers spend significant amounts of time identifying sources of EMR and designing fixes to reduce EMR.

The high frequency digital signals necessary to perform the function of a computer system are transmitted from one component to the next on conductive traces routed on planes or layers of multilayer printed circuit boards (PCBs). These signal traces are a primary source of EMR. EMR is also conducted to the power plane of the PCB through common impedance noise coupling. Electrostatic shields can be very effective in isolating, reducing or even eliminating EMR. One of the most effective electrostatic shields is a metal box or a closed metal shell comprising a low impedance element preferably coupled to ground or to a common voltage level. The underlying principle is that a charge from an external potential can not exist on the internal portion of the shield, and vice versa, so that the electric field is theoretically eliminated. It is impracticable to implement completely closed metal shells in computer systems, so that shields are typically implemented as partial shells, or metal walls and barriers. Even partial metal shields, however, increase cost, add weight restrict airflow and consume Valuable space. Furthermore, metal shields are difficult and inconvenient to implement for use with PCBs.

Therefore, it is desirable to provide an apparatus or method to significantly reduce EMR generated by high speed digital signals residing on internal planes of PCBs without adding components, consuming space, increasing weight or significantly increasing cost.

SUMMARY OF THE PRESENT INVENTION

A printed circuit board (PCB) according to the present invention uses grounded conductive vias and traces to reduce electromagnetic radiation (EMR) caused by high speed logic signals residing on internal signal planes. Since high speed logic signals are a primary source of EMR, a computer system designed according to the present invention may qualify for class B rating with little or no additional design effort. The use of conductive vias and traces coupled to the ground plane achieves a very effective electromagnetic shield and reduces EMR without using additional components, without consuming much space, without adding weight and without significantly increasing cost. Vias and traces are already the primary means of conducting signals on a PCB, so that a PCB according to the present invention is only slightly modified to achieve significant results.

A series of conductive circumferential vias are placed in a circuitous path near the border of a PCB, which encircles the signal traces and component placement portions of the PCB. The circumferential vias are preferably formed by drilling holes penetrating all layers of the PCB, and filling the holes with a conductive material such as copper. The circumferential vias are preferably spaced approximately one-quarter inch apart corresponding to the wavelengths of the primary and harmonic components of a 66 MHz clock signal, which is the highest clock speed used in the preferred embodiment. The spacing between the circumferential vias of different PCBs may vary depending upon the frequencies used and dielectric constants of materials in a given application. The conductive portion of the ground plane is extended outwards to encompass and electrically connect to the circumferential vias, so that the circumferential vias are grounded. On each of the internal signal planes, a conductive trace is routed to connect to each of the circumferential vias in a "connect the dot" fashion, thereby essentially providing a grounded trace surrounding the signal traces of each internal signal layer. This trace is preferably 30 milliinches (mils) in width forming a grounded electrostatic shield, which significantly reduces the noise generated by the edges of the high speed digital signals on the signal traces.

Furthermore, a conductive trace is preferably routed to surround the conductive portion of the power layer. The power layer conductive trace also connects to each via in the same connect-the-dot fashion as on the signal layers, providing an effective electrostatic shield for the power plane. The conductive trace around the power plane is preferably approximately 60 mils in width to meet thermal wiring specifications between the power and ground planes. A non-conductive path is placed between the power plane conductive path and the conductive portion of the power plane to electrically isolate the power plane voltages from the grounded conductive trace. The nonconductive isolation path is preferably approximately 30 mils wide.

The additional circumferential vias and conductive traces consume very little additional space, add negligible weight and do not significantly increase the cost of producing the PCB. No additional components are necessary. The grounded circumferential vias and conductive traces form a cage and bar structure which serves as an effective electrostatic shield circumscribing the digital signals of the PCB, thereby significantly reducing EMR.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
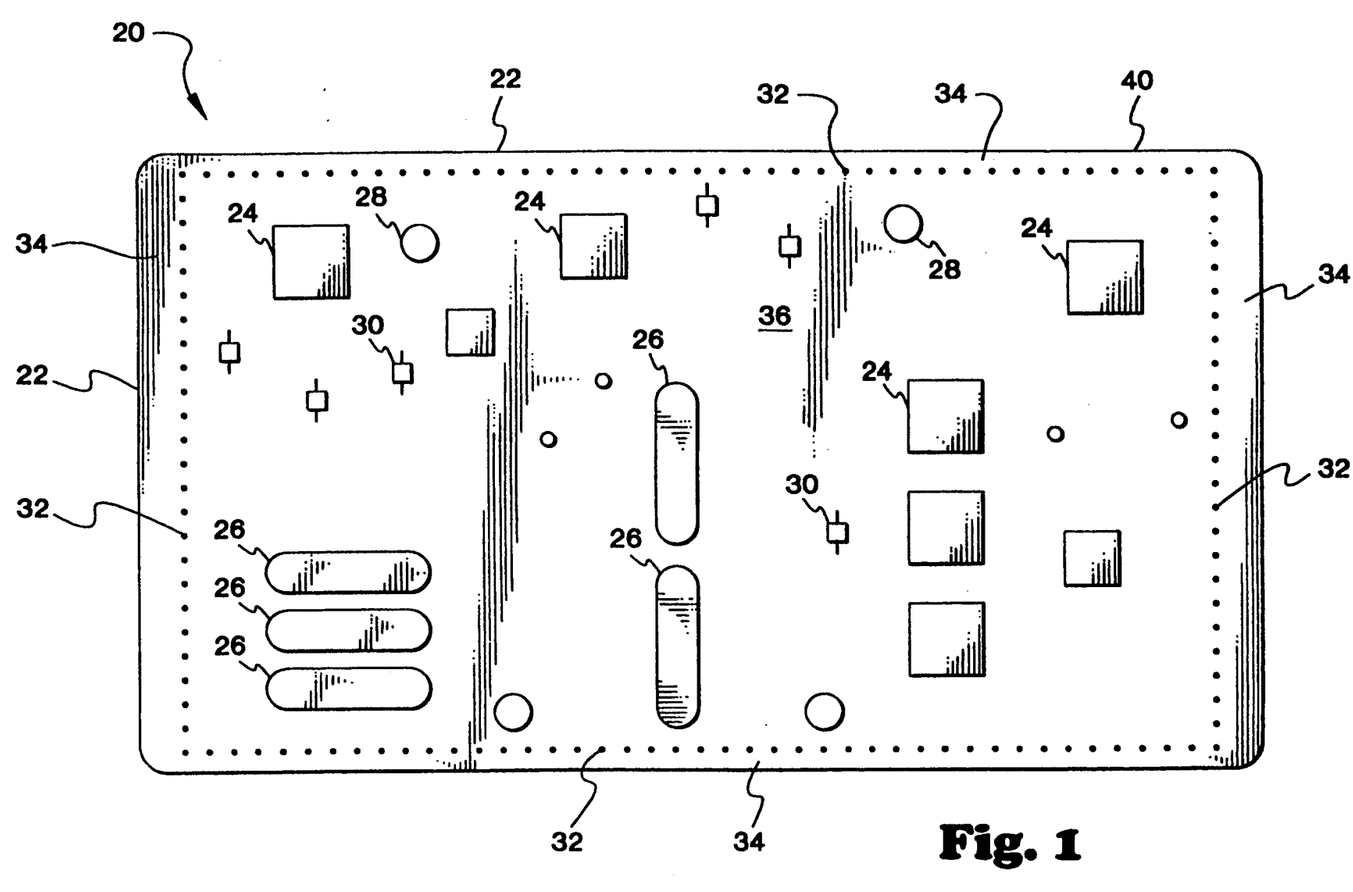
FIG. 1 is a top view of a simplified diagram of a printed circuit board according to the present invention.

Referring now to FIG. 1, a top view of a simplified diagram of a multilayer printed circuit board (PCB) 20 is shown which is implemented according to the present invention. The PCB includes several layers including a top layer 40, at least one internal ground layer or ground plane 50 (FIG. 3), at least one internal signal layer 60 (FIG. 4), at least one power layer or power plane 70 (FIG. 5) and a bottom layer 80 (FIG. 6). Although only one power plane 70 and ground plane 60 is shown, a PCB according to the present invention could include several power and ground planes. Each of the layers are preferably made of copper on epoxy glass such as FR-4, although other types of di-electric materials, such as polyimide glass/copper, cyanate ester glass-/copper, Aramid/copper, PTFE/copper and ceramic/-copper, may be used as known to those skilled in the art of fabricating multilayer PCBs. The PCB 20 is preferably rectangular in shape including an edge 22, although the present invention is not limited to any particular geometric shape of PCBs. A plurality of integrated circuits 24, connectors 26 and discrete components 28 and 30 are shown mounted on the PCB 20 for purposes of illustration and will generally be referred to as electrical components 24-30.

The electrical components 24-30 are mounted on the PCB 20 in a component mounting area 36, which is essentially outlined by a plurality of circumferential conductive vias 32 according to the present invention circumscribing the component mounting area 36. The circumferential vias 32 are typically formed by drilling holes through all layers of the PCB 20 in a circuitous path around the PCB 20 as shown, and filling the holes with a conductive material. The conductive material used is preferably solder, although other conductors may be used as generally known by those skilled in the art of PCB manufacturing. The holes drilled for the circumferential vias 32 are preferably approximately 18 mils in diameter and are preferably spaced approximately one-quarter inch apart, although this spacing distance may vary slightly on a given board. In the preferred embodiment, the highest clock frequency is approximately 66 MHz, so that one-quarter inch corresponds to the wavelengths of the primary and harmonic components of the 66 MHz digital signals. The spacing between the circumferential vias 32 should correspond to the wavelengths of the highest frequency components generated on the PCB 20. Thus, as the frequencies increase, the spacing should decrease proportionately.

A border area 34 is defined between the edge 22 and the component mounting area 36 as separated by the circuitous path formed by the circumferential vias 32. In general, conductive signal traces 44 (FIG. 2) are routed on the internal and external layers of the PCB 20 to electrically connect the inputs and outputs of the electrical components 24-30 mounted within the component mounting area 36 in the preferred embodiment. The conductive signal traces 44 are also preferably copper, although other conductive materials may be used. In this manner, the circumferential vias 32 circumscribe all of the signal traces 44 routed on the layers of the PCB 20.

Figure 2:
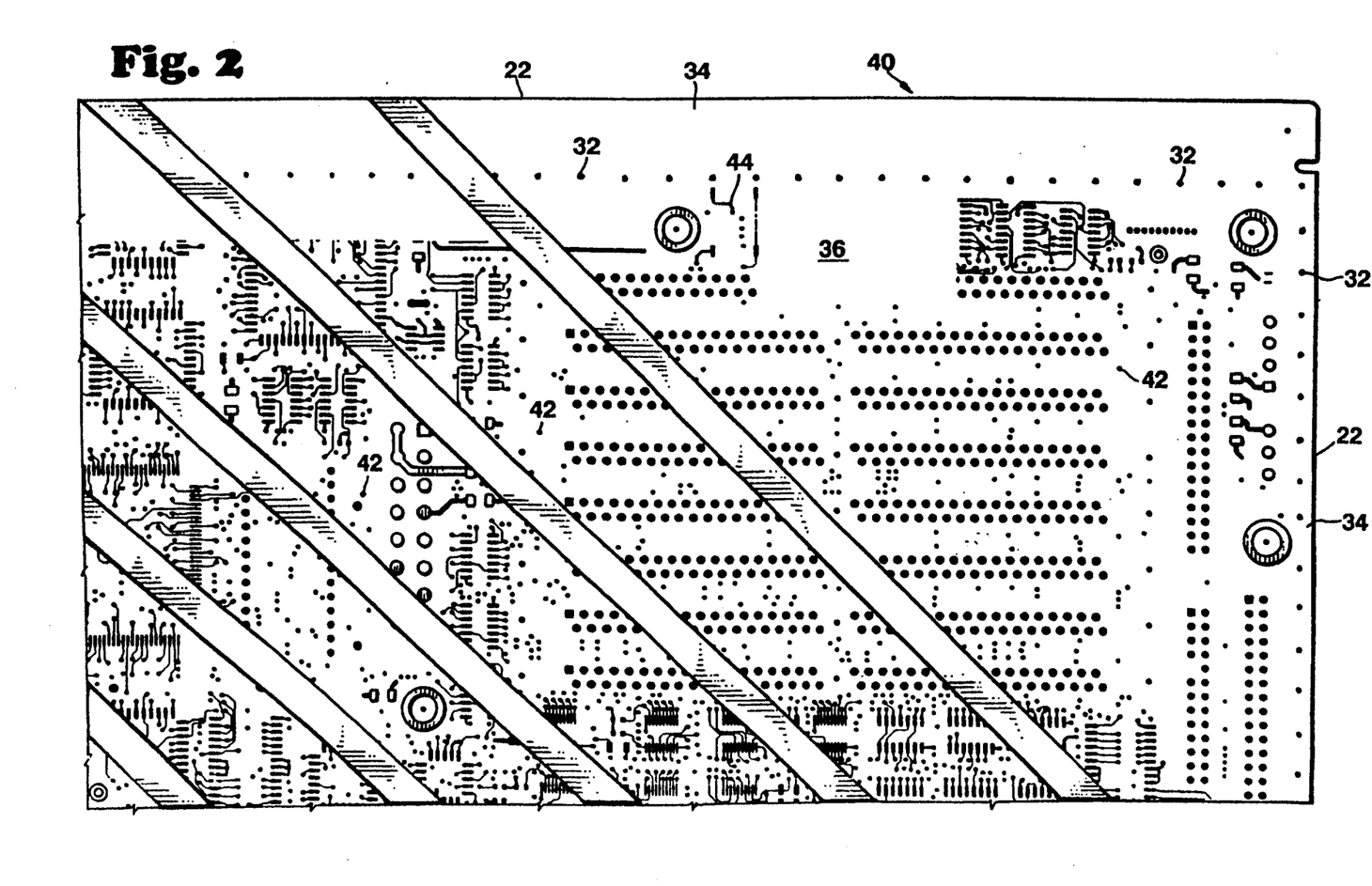
FIG. 2 is a more detailed diagram of a portion of the top layer of the printed circuit board of FIG. 1.

Referring now to FIG. 2, a more detailed diagram of a portion of the top layer 40 of the PCB 20 is shown, which is partially masked to prevent disclosure of proprietary information not relevant to the present invention. All of the relevant portions relating to the present invention are shown, whereas masked portions are not necessary for disclosing and fully describing a PCB 20 according to the present invention. The darker areas of the top layer 40 generally designate conductive areas or traces and the lighter areas signify nonconductive areas, with the exception that the border 22 is not a conductive area. The circumferential vias 32 are more clearly shown circumscribing the component mounting area 36 and generally defining the inner edge of the border area 34.

The dark circles and pads generally illustrate locations of the terminals of the electronic components 24-30, many of which generate the high frequency digital signals. The dark circles also include conductive interconnection vias 42 for connecting a layer to other layers. These high frequency digital signals are carried from one component to another on the signal traces 44 routed on the top layer 40, the bottom layer and signal layers 60, and are also carried from one layer to the other layers through the interconnection vias 42. Again, it is clear that the electrical components 24-30 are mounted in the component mounting area 36 and the signal traces 44 are confined within the component mounting area 36 so that the conductive circumferential vias 32 circumscribe the electrical components 24-30 and the signal traces 44.

Figure 3:
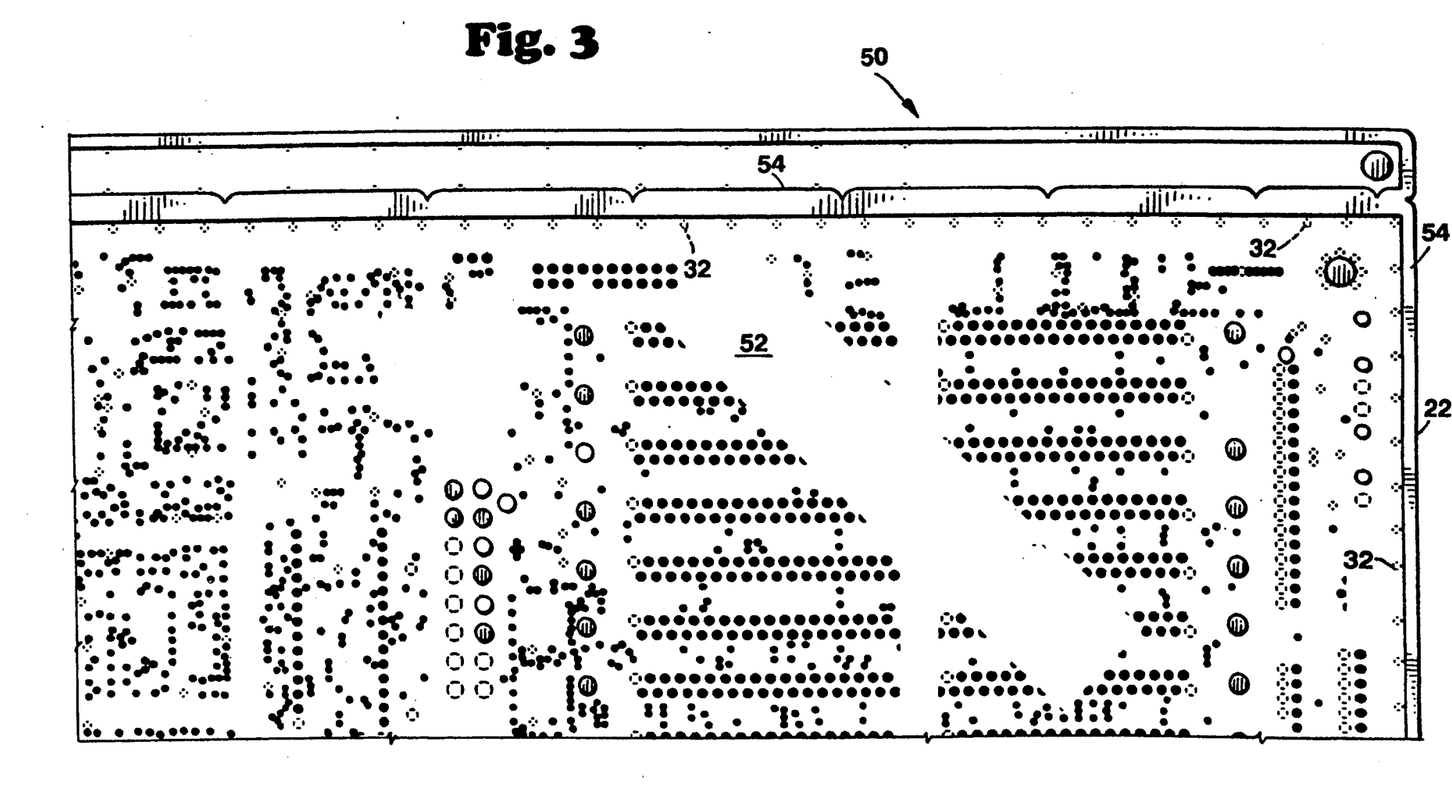
FIG. 3 is a partial diagram of the ground plane of the printed circuit board of FIG. 1.

Referring now to FIG. 3, a partial diagram of the ground plane 50 of the PCB 20 is shown. Only one ground plane is illustrated, it being understood that there may be more than one ground plane. Certain portions of the ground plane 50 are masked for the same purpose described above. In FIG. 3, a reverse image is shown of the ground plane 50 where lighter areas signify areas of conduction and dark areas signify areas of nonconduction. A layer of conductive material is preferably etched on the ground plane 50 and will generally be referred to as the conductive portion 52. The conductive portion 52 of the ground plane 50 is electrically connected to only those points and areas of the electrical circuit requiring grounding. The ground plane 50 is preferably coupled to chassis ground of a computer system or other electronic device incorporating the PCB 20, although the ground plane 50 may also define a signal which is common to most or all signals on the PCB 20.

Solid dark circles signify points of non-connection to and non-conduction with the conductive portion 52, whereas dashed circles signify points of connection to and conduction with the conductive portion 52. The dashed circles also denote thermal connections preferably approximately 60 mils in diameter to meet thermal wiring specifications as known to those skilled in the art of PCB fabrication. The conductive portion 52 of the ground plane 50 extends beyond the circumferential vias 32 of the ground plane 50 and encompasses the circumferential vias 32. The circumferential vias 32 are also indicated as dashed circles indicating that the conductive portion 52 is electrically connected to the circumferential vias 32 preferably using thermal connections, so that preferably all of the circumferential vias 32 are grounded to the ground plane 50 in the preferred embodiment. The conductive portion 52 of the ground plane 50 is circumscribed by a nonconducting border 54. In this manner, the circumferential vias 32 circumscribing the component mounting area 36 of the PCB 20 are all grounded to the ground plane 50 forming a cage and bar structure of grounded circumferential vias 32 surrounding the signal traces 44 and electrical components 24-30 of the PCB 20.

Figure 4:
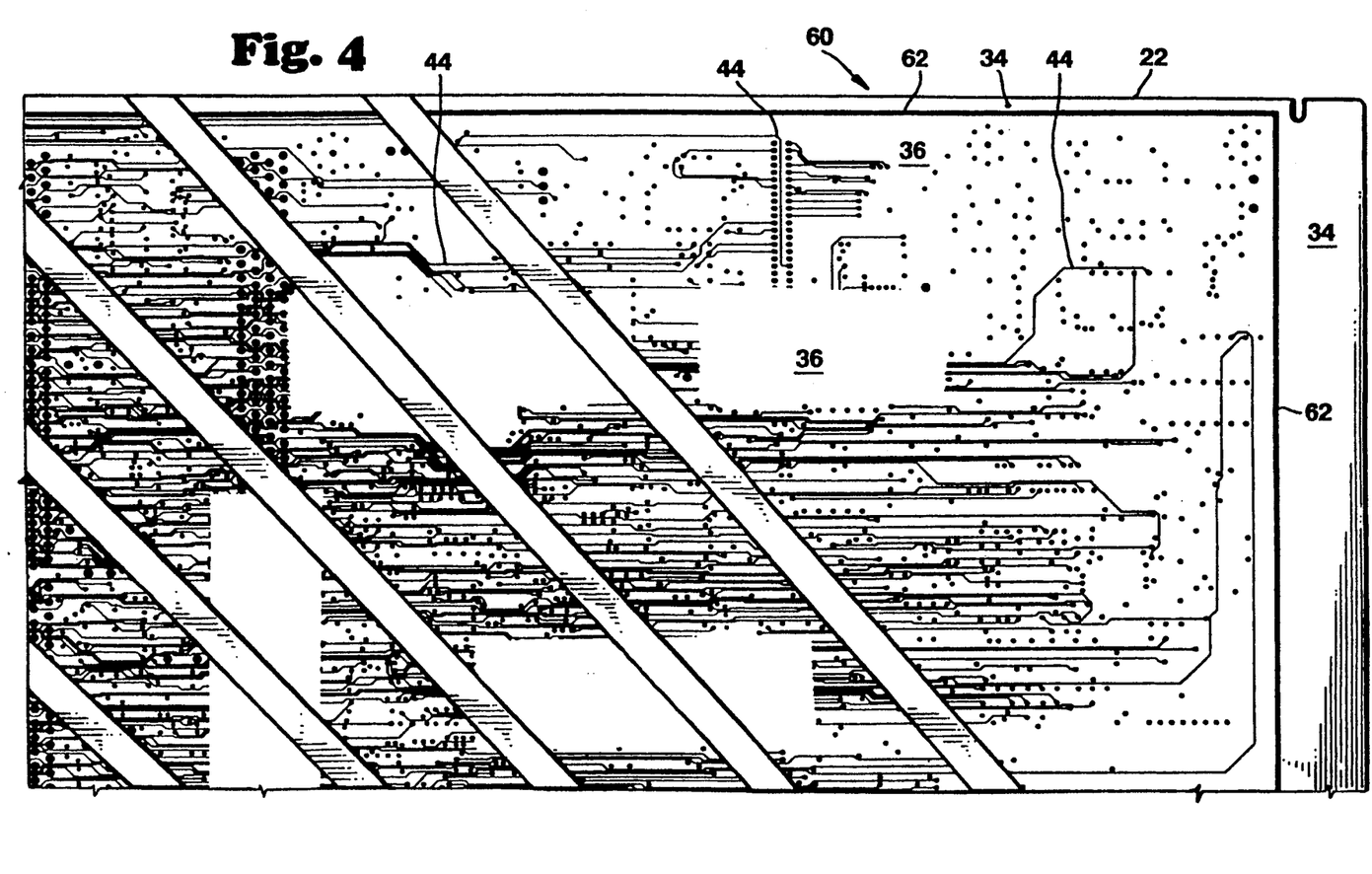
FIG. 4 is a partial diagram illustrating a signal plane of the printed circuit board of FIG. 1.

Referring now to FIG. 4, a partial diagram of a typical internal signal layer 60 of the PCB 20 is shown, again where certain portions of the signal plane 60 are masked. Only one signal layer is illustrated, but it is understood that there may be, and often are, numerous internal signal layers in the PCB 20. It is also noted that a different corner of the PCB 20 is shown to further preserve the proprietary information. In FIG. 4, the dark areas signify areas of conduction and the light areas signify areas of nonconduction, except that the edge 22 of the PCB 20 is not a conducting area. A conductive trace 62 is shown circumscribing the component mounting area 36 electrically connecting to each of the circumferential vias 32 in a "connect the dot" fashion, so that the conductive trace 62 generally follows the circuitous path of the circumferential vias 32, and is grounded through the circumferential vias 32 to the ground plane 50. Although not shown in FIG. 4, each via 32 includes a via pad preferably 30 mils in diameter to facilitate electrical connection to the conductive trace 62. The conductive trace 62 encompasses the entire component mounting area 36 of the PCB 20, and is also preferably 30 mils in width for purposes of convenience, although other widths of the conductive trace 62 may be used. Each of the signal planes of the PCB 20, such as the signal plane 60, includes a grounded conductive trace similar to the conductive trace 62. In this manner, the conductive traces 62 and the conductive circumferential vias 32 form a grounded cage and bar structure circumscribing all of the signal traces 44 of the PCB 20, which effectively operates as an electromagnetic shield for the PCB 20.

Figure 5:
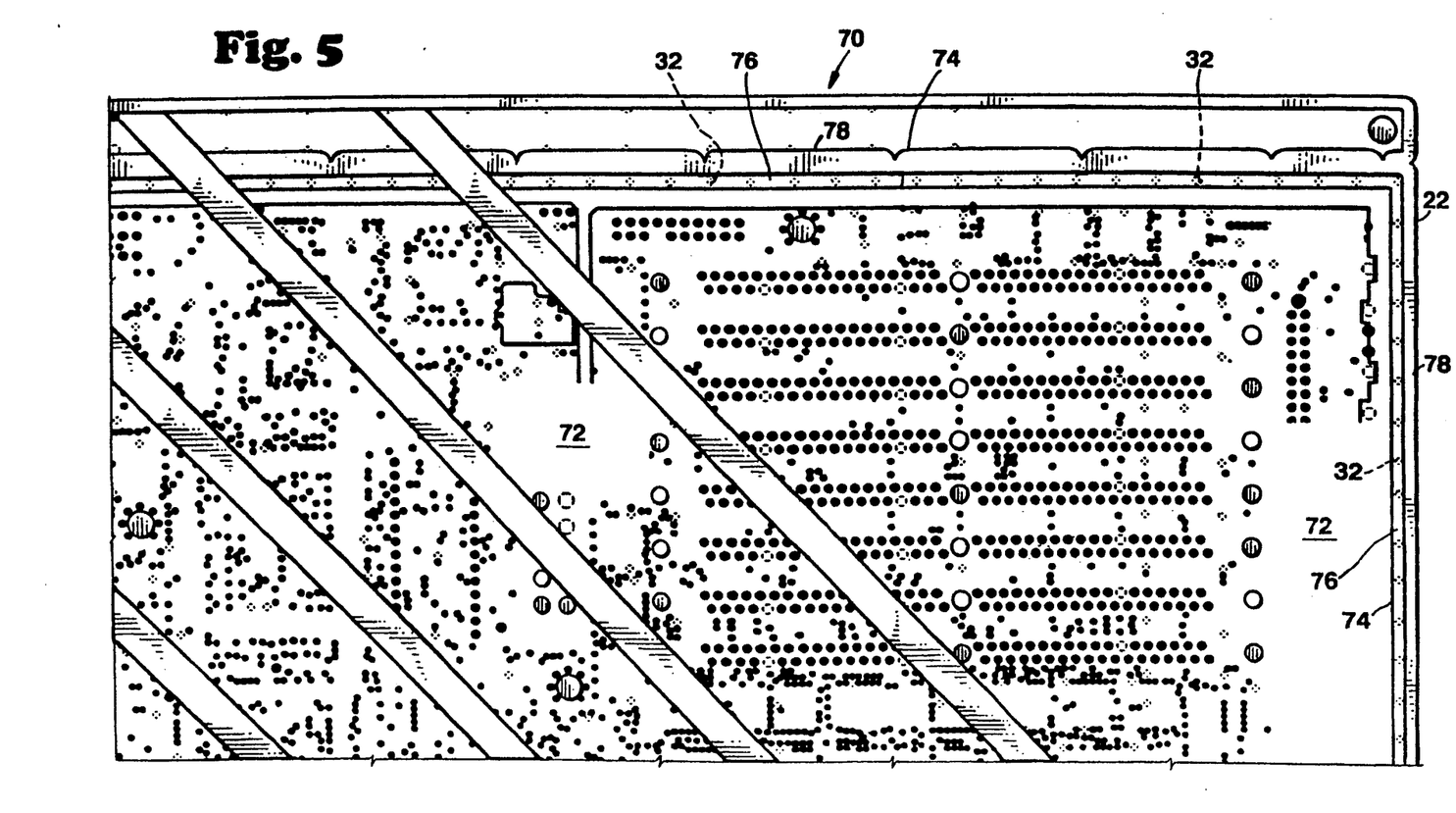
FIG. 5 is a partial diagram illustrating a power plane of the printed circuit board of FIG. 1.
Figure 6:
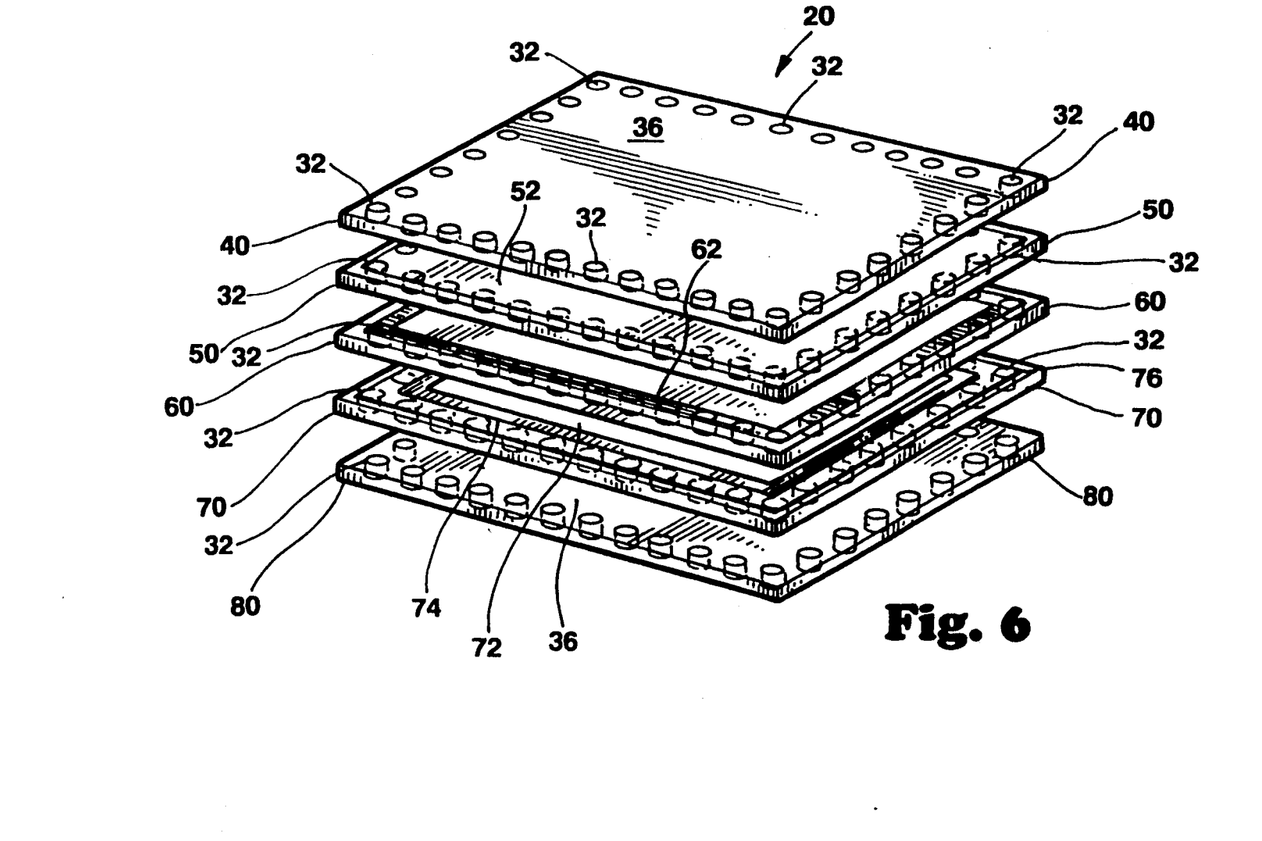
FIG. 6 is an exploded, simplified perspective view of the circuit board of FIG. 1.

Referring now to FIG. 5, a partial diagram of a power plane 70 of the PCB 20 is shown, where again certain portions of the power plane 70 are masked for the same purpose described above. Only one power plane is illustrated, it being understood that there may be more than one power plane. In FIG. 5, lighter areas signify areas of conduction and darker areas signify areas of nonconduction. The power plane 70 includes a conductive portion 72 similar to the conductive portion 52 of the ground plane 50, where the conductive portion 72 extends outward from the component placement area 36 towards the circumferential vias 32. The conductive portion 72 of the power plane 70 does not extend all the way to the circumferential vias 32, however, but is circumscribed by a nonconductive path 74, which is itself circumscribed by the circumferential vias 32.

A conductive trace 76 is routed to electrically connect together each of the conductive circumferential vias 32 in the same connect the dot fashion and generally following the same circuitous path as the conductive traces 62 on the signal planes 60. The nonconducting path 74 isolates the conductive path 76 from the conductive portion 72. Again, the same 60 mil thermal connections are preferably used to connect the circumferential vias 32 to the conductive trace 76 as was used on the ground plane 50, where these connections are indicated by dashed circles. The conductive trace 76 is also preferably 60 mils in width to meet thermal wiring specifications between the power planes 70 and the ground planes 50. Thus, the conductive trace 76 circumscribes the nonconducting path 74 and the conducting portion 72 of the power plane 70, where the conductive trace 76 is grounded through the circumferential vias 32 to the conductive portion 52 of the ground plane 50. Also, the conductive trace 76 is itself circumscribed by a nonconducting border 78 similar to the nonconducting border 54 on the ground plane 50. In this manner, the power plane 70 is also circumscribed by a grounded conductive trace 76 in a similar manner as described above for the signal planes 60, so that all of the internal signal and power layers of the PCB 20 are circumscribed by the grounded cage and bar structure implementing an electromagnetic shield.

It is noted that a power supply (not shown) applies a voltage potential between the conducting area 72 of the power plane 70 and the conductive area 52 of the ground plane 50 to provide power to the electronic components 24-30 mounted on the PCB 20. The electronic components 24-30 generate signals on the signal traces 44, many of which signals are preferably high speed digital signals clocked by the 66 MHz clock signal. It is known that common or mutual impedances exist between the signal traces 44 and the conductive area 72 of the power plane 70 due to the electronic components 24-30, so that electric noise is coupled into the conductive portion 72 of the power plane 70. Thus, the power plane 70 also is a source of EMR. The conductive path 76 provides an electromagnetic shield around the power plane 70 to prevent significant amounts of EMR from being radiated by the power plane 70.

Referring now to FIG. 6, an exploded, simplified perspective view of the printed circuit board of FIG. 1 is shown. FIG. 6 clearly shows the cage and bar structure formed by the circumferential conductive vias 32 and the conductive traces 62 and 72, which surround the signal traces 44 of the PCB 20.

The EMR reduction technique according to the present invention can now be appreciated in view of the above description and FIGS. 1-6. A power supply provides power between power planes 70 and ground planes 50, providing power to electronic components 24-30 of the PCB 20. The electronic components 24-30 generate high speed digital signals on signal traces 44 on the top layer 40, the bottom layer and the signal layers 60 of the PCB 20. As described previously, these high speed digital signals on the signal traces 44 generate electrical energy due to the fast rise and falling edges, where this electrical energy would otherwise cause EMR which is radiated beyond the border 22 of the PCB 20. The EMR is coupled through stray capacitances in nearby electrical circuitry resulting in EMI or noise spikes within the nearby circuitry.

An EMR shield formed by the conductive circumferential vias 32 connected to the conductive portion 52 of the ground plane 50, to the conductive traces 62 on the signal layers 60 and also connected to the conductive traces 76 on the power planes 70 of the PCB 20, form an electromagnetic shield which suppresses or captures the electric noise generated by the high speed digital signals. Since this electromagnetic shield is preferably grounded, much of the electromagnetic energy is grounded by the shield so that EMR is significantly reduced. Although the top and bottom layers preferably do not include a circumferential conductive trace, such as the conductive traces 62 and 72, the circumferential vias 32 and conductive traces 62 and 72 on the internal layers are effective to reduce EMR to acceptable levels. In fact, the first prototype version of a computer system according to the present version qualified for an FCC class B rating in spite of frequency levels above 50 MHz.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

I claim:

1. A printed circuit board, comprising:
   a plurality of layers, each said layer having an inner component area circumscribed by a border area, wherein one of said layers is a ground plane, one of said layers is a power plane, and at least one of said layers is a signal layer;

each layer including a plurality of conductive vias penetrating said layer, said conductive vias being located between said inner component area and said border area of each said layer, wherein said conductive vias define a circuitous path circumscribing said inner component area of each said layer and wherein said layers are stacked together so that each one of said plurality of conductive vias are aligned and in conductive contact with corresponding conductive vias of every other one of said plurality of layers;

said ground plane including a conductive portion covering part of the inner component area of said ground plane, said conductive portion of said ground plane also extending to and electrically coupling to each of said plurality of conductive vias;

each said signal layer including a conductive trace routed between said border area and said inner component area of said signal layer, said signal layer conductive trace generally following said circuitous path and electrically connecting to each of said conductive vias to circumscribe the inner component area of said signal layer; and said power plane including a conductive portion covering part of said power plane inner component area, and also including a conductive trace routed between said border area and said inner component area of said power plane, said power plane conductive trace generally following said circuitous path and electrically connecting to each of said vias to circumscribe the inner component area of said power plane, said power plane further including a nonconductive electrical isolation path between said power plane conductive portion and said power plane conductive trace.

2. The printed circuit board of claim 1, wherein said plurality of conductive vias are spaced approximately one quarter inch apart.

3. The printed circuit board of claim 1, wherein said plurality of conductive vias are approximately 18 milliinches in diameter filled with an electrically conductive material.

4. The printed circuit board of claim 1, wherein said signal layer conductive trace is approximately 30 milliinches wide.

5. The printed circuit board of claim 1, wherein said power plane conductive trace is approximately 60 milliinches wide.

6. The printed circuit board of claim 1, wherein said power plane, said ground plane and each of said signal layers are internal layers of the printed circuit board.

7. The printed circuit board of claim 1, wherein the conductive portions including said ground plane conductive portion, said signal layer conductive trace, said power plane conductive portion and said power plane conductive trace are formed of copper.

* * * * *